United States Patent
Yamasaki et al.

[11] Patent Number: 5,182,477
[45] Date of Patent: Jan. 26, 1993

[54] BIPOLAR TUNABLE TRANSCONDUCTANCE ELEMENT

[75] Inventors: Richard G. Yamasaki, Torrance; Geert A. De Veirman, Irvine, both of Calif.

[73] Assignee: Silicon Systems, Inc., Tustin, Calif.

[21] Appl. No.: 823,067

[22] Filed: Jan. 14, 1992

Related U.S. Application Data

[63] Continuation of Ser. No. 497,863, Mar. 22, 1990.

[51] Int. Cl.[5] .......................... H03F 3/45; H03K 5/20
[52] U.S. Cl. ..................... 307/494; 307/498; 307/555; 307/562; 328/160; 330/252; 330/260; 330/306
[58] Field of Search ............... 307/490, 491, 494, 498, 307/555, 562, 264, 268; 328/115, 172, 170, 160; 330/252, 260, 258, 261, 303, 306

[56] References Cited

U.S. PATENT DOCUMENTS

| | | | |
|---|---|---|---|
| 3,989,958 | 11/1976 | Renirie et al. | 307/491 |
| 3,989,959 | 11/1976 | Renirie et al. | 307/491 |
| 4,292,597 | 9/1981 | Niimura et al. | 330/261 |
| 4,823,092 | 4/1989 | Pennock | 330/258 |
| 4,881,043 | 11/1989 | Jason | 330/252 |
| 4,918,398 | 4/1990 | Haijsing et al. | 330/252 |
| 4,951,003 | 8/1990 | De Jager et al. | 330/252 |
| 4,977,378 | 12/1990 | Tero | 330/252 |

Primary Examiner—Edward P. Westin
Assistant Examiner—Richard Roseen
Attorney, Agent, or Firm—Hecker & Harriman

[57] ABSTRACT

The present invention is a new design for transconductance elements useful in high-frequency filters such as fully differential state-variable biquads. The present invention enjoys a large dynamic range. It is built with simple circuitry to reduce parasitic capacitance which impedes high-frequency operation. It is easily tunable for use in programmable filters. It is configured in a fully differential circuit and operates on five volts. The present invention is also very useful for implementing dual-input or multiple input transconductance elements. By incorporating additional current sources in the present invention, another degree of freedom is added to the determination of pole frequency and pole quality factors, when the transconductance is used as a biquad filter building block.

9 Claims, 5 Drawing Sheets

FIG. 1c

FIG. 1b CIRCUIT MODEL

BIPOLAR TUNABLE TRANSCONDUCTANCE ELEMENT

This is a continuation of application Ser. No. 497,863 filed Mar. 22, 1990.

BACKGROUND OF THE INVENTION

1. Field of the Invention

This invention relates to the design of tunable transconductance elements and monolithic continuous-time filters.

2. Background Art

Monolithic, continuous-time, high-frequency filters are preferably based on capacitors and transconductances rather than operational amplifiers. In general, the transconductance building blocks are subject to a number of strict requirements. They must have a large dynamic range. They must be built with simple circuitry so as to reduce parasitic capacitance characteristics at high-frequency operation. They must be easily tunable for use in programmable filters, a common application. They are preferably configured in a fully differential circuit for superior PSRR (power supply rejection ratio), CMRR (common-mode rejection ratio), and second-order distortion cancellation. They preferably operate on 5 volts.

In the past, transconductances have suffered severely in their tunability. Prior art circuits are not suitable for high frequencies and meet the desirable criteria above. High-frequency filters implemented with transconductances, theoretically the most desirable building block for such filters, were unusable because of a bandwidth and/or dynamic range limitation.

Prior art devices encumber the task of implementing a differential input or multiple input transconductance element.

Therefore, it is an object of the present invention to increase the achievable frequency range of operation of a tunable transconductance element with large dynamic range.

It is also an object of the present invention to facilitate the setting of pole frequencies and pole quality factors of a biquad filter section based on these transconductance elements.

It is also an object of the present invention to provide a transconductance circuit element with minimized parasitic capacitance and output conductance.

It is a further object of the present invention to create a transconductance element whose basic design can accommodate single or multiple inputs.

It is also an object of the present invention to design a multiple input transconductance which maintains low output admittance (high output impedance).

SUMMARY OF THE PRESENT INVENTION

A new design for bipolar tunable transconductance elements is disclosed. The invention is an improvement over prior art designs in that it solves bandwidth problems associated with such devices. By incorporating additional current sources into the transconductance building block, the present invention adds another degree of freedom to the predetermination of pole frequency placement and pole quality factors of transconductance-C filter elements. As a result of the new design, tunable transconductance elements are more readily implemented. Also described in the invention is a circuit which implements the new ideas in a multiple-input transconductance element.

The present invention comprises symmetrical, parallel-connected circuits that receive the positive and negative ends of an input voltage. In that a transconductance element is described, the input is a voltage level and the output is a current. Each symmetrical circuit is comprised of cascaded input and gain stages. That is, the positive end of the input voltage is applied to the input stage of the positive end circuit, where it is transformed into a current by the gain stage of that same circuit half. The negative end of the input voltage is applied to the input stage of the negative input voltage circuit, which then amplifies the signal power to provide an output current through the respective gain stage. The gain stages of the positive and negative halves of the circuit each contain biasing transistors (current source loads), which are modulated by an averaging and comparing circuit input to the bases of those two biasing transistors. This averaging and comparing circuit stabilizes the common-mode voltage level.

New degrees of flexibility are gained in the transconductance element of the present invention by the injection of currents to the junction between the respective input and gain stages of both the positive and negative circuit halves that comprise the present invention.

DETAILED DESCRIPTION OF THE INVENTION

The necessary components for implementing a bipolar tunable transconductance element are described. In the following description, numerous specific details are set forth, such as voltage polarity, semiconductor type, etc., in order to provide a more thorough understanding of the present invention. It will be obvious, however, to one skilled in the art, that the present invention may be practiced without these specific details. In other instances, well-known circuits have not been described in detail in order not to unnecessarily obscure the present invention.

A transconductance element is an element which converts an input voltage into an output current. An ideal transconductance has infinite input and output impedances. Bipolar tunable transconductance elements are typically based on a Gilbert multiplier core which comprises an emitter coupled pair of transistors that provides an exponential function.

Figures 1A, 1B, 1C:
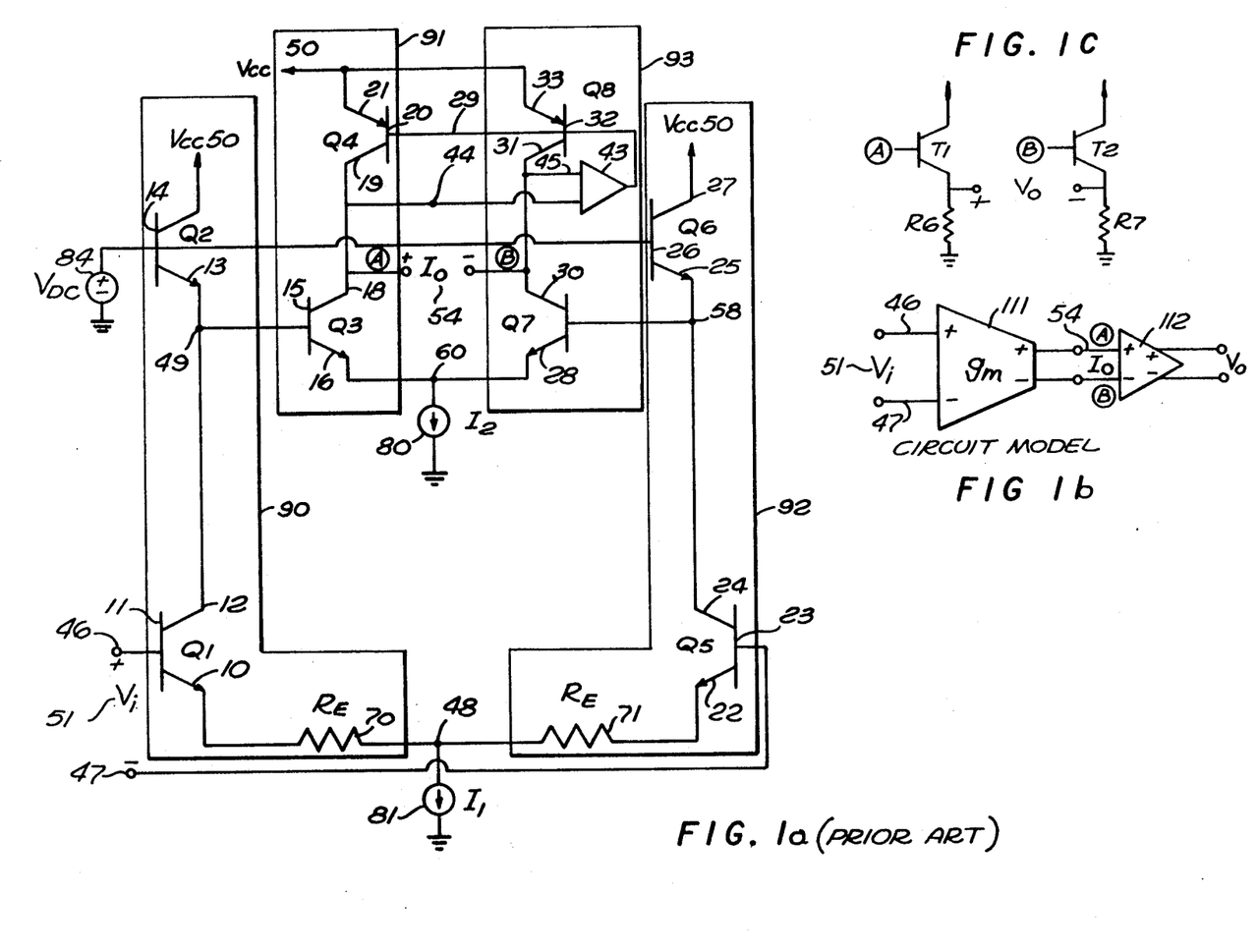
FIG. 1a is an example of a prior art transconductance element.
FIG. 1b is a model of the circuit of FIG. 1.
FIG. 1c is a circuit diagram of a buffer/level shifter.

A traditional Gilbert multiplier-based transconductance element is shown in FIG. 1a. An input voltage $V_i$ 51 is coupled to input terminals 46 and 47. Input terminal 46 is a positive terminal and input 47 is a negative input terminal. Input terminal 46 leads to a positive end input stage generally comprised of the elements enclosed within box 90. Terminal 47 is coupled to a negative end input stage generally comprised of the elements enclosed within box 92.

Positive end input stage 90 is comprised of transistors Q1 and Q2 and resistor 70. The input terminal 46 is coupled to the base 11 of transistor Q1. The emitter 10 of transistor Q1 is coupled to one end of resistor 70. The other terminal of resistor 70 is coupled to node 48. The base 14 of transistor Q2 is coupled to a DC voltage 84. The emitter 13 of transistor Q2 is coupled to the collector 12 of transistor Q1 at node 49. The collector of transistor Q2 is coupled to a supply voltage $V_{cc}$ 50.

Negative end input stage 92 is comprised of transistors Q5 and Q6 and resistor 71. The negative input terminal 47 is coupled ot the base 23 of transistor Q5. The emitter 22 of transistor Q5 is coupled to emitter resistor 71. The other terminal of resistor 71 is coupled to node 48. The base 26 of transistor Q6 is also coupled to the DC voltage 84. The emitter 25 of transistor Q6 is coupled to the collector 24 of transistor Q5 at node 58. The collector 27 of transistor Q6 is coupled to supply voltage $V_{cc}$ 50.

The positive end input stage 90 is coupled to a positive end gain stage generally comprised of the elements contained within box 91. The negative end input stage 92 is coupled to a negative end gain stage generally comprised of the elements contained within box 93.

The positive end gain stage 91 is comprised of transistors Q3 and Q4. The base 15 of transistor Q3 is coupled to the junction of emitter 13 of transistor Q2 and collector 12 of transistor Q1 at node 49. The emitter 16 of transistor Q3 is coupled to node 60. The emitter 21 of transistor Q4 is coupled to supply voltage $V_{cc}$ 50 and the collector 19 of transistor Q4 is coupled to the collector 18 of transistor Q3 at node 44.

The base of transistor Q7 is coupled to the junction of emitter 25 of transistor Q6 and collector 24 of transistor Q5 at node 58. The emitter 28 of transistor Q7 is coupled to node 60. The negative end gain stage includes an operational amplifier 43 having one input coupled to node 44 and the other input coupled to node 45 which is the junction of the collector 31 of transistor Q8 and the collector 30 of transistor Q7. The output 29 of op amp 43 is coupled to the bases 20 and 32 of transistors Q4 and Q8, respectively. The emitter 33 of transistor Q8 is coupled to the supply voltage $V_{cc}$ 50. The output of the transconductance element illustrated in FIG. 1a is current $I_0$ 54 taken at the collectors 18 and 30 of transistors Q3 and Q7, respectively. Current $I_2$ 80 is taken from node 60 and current $I_1$ 81 is taken from node 48.

The transconductance circuit of FIG. 1a is illustrated symbolically in FIG. 1b. The input $V_I$ 51 is coupled to the transconductance element 111 at inputs 46 and 47. The transconductance element 111 provides output current $I_0$ 54 to the buffer/level shifter 112. The level shifter 112 provides an output voltage $V_0$. This buffer is shown in detail in FIG. 1c. The base of transistor T1 is coupled to the A input (positive input) of buffer 112. The emitter of transistor T1 is coupled through resistor R6 to ground. The B (negative) input of buffer 112 is coupled to the base of transistor T2. The emitter of transistor T2 is coupled through resistor R7 to ground. Voltage $V_0$ is taken between the emitters of transistors T1 and T2.

The transconductance of the circuit illustrated in FIG. 1a is:

$$G_M = I_0/V_i = (1/R_E)(I_2/I_1) \qquad [\text{Eq. 1}]$$

When this transconductance is used as a building block in high-frequency filters, it suffers from the following limitations. Input dynamic range considerations determine the minimum value of the product $R_E \times I_1$. On the other hand, the transconductance must be loaded by a capacitor C, resulting in a time constant:

$$\tau = C/G_M = CR_E(I_1/I_2) \qquad [\text{Eq. 2}]$$

This time constant is inversely proportional to the desired pole frequency. Hence, $$\omega_0 \sim I_2/(CR_E I_1) \qquad [\text{Eq. 3}]$$

The realization of high-frequency filters is seriously hampered by the following difficulties:
1) The product $R_E \times I_1$ is already fixed.
2) C cannot be made arbitrarily small, since it must be at least one order of magnitude larger than the hard to model parasitic stray capacitances at the output node in order to maintain design predictability.
3) Increasing $I_2$ is no solution, for two reasons:
   a) Excessive power consumption;
   b) Lack of high-current transistors.

A large majority of bipolar processes provide only lateral PNP transistors, which are severely current limited. As a result, increasing the current $I_2$ requires increased transistor dimension accompanied by a growing stray capacitance. Furthermore, since a transistor's output conductance is proportional to its collector current, additional current $I_2$ results in an increasingly less ideal transconductance. The latter problem is particularly significant in modern high-frequency shallow junction bipolar processes, characterized by low transistor output resistances. Well-known circuit techniques to increase the output resistance violate requirements on the circuit, namely, that it have a large dynamic range, simple circuitry, and 5 volt operation.

Figures 2A, 2B:
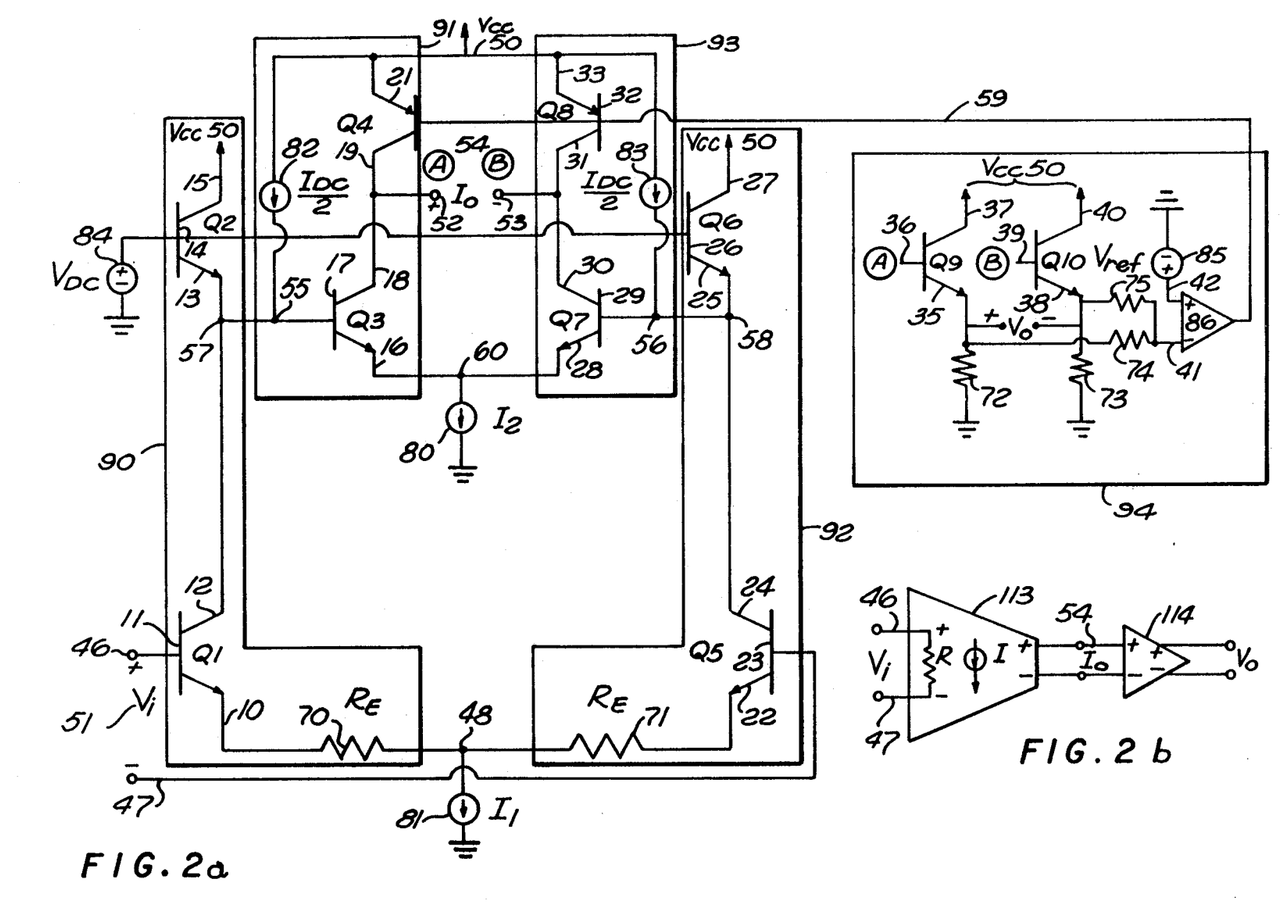
FIG. 2a is an embodiment of the present invention.
FIG. 2b is a model of the circuit of FIG. 2.

The apparent paradox can be solved by injecting a current via current sources 82 and 83 shown in FIG. 2a. Also included in FIG. 2a is a level-shifting output buffer, biaser 94. The common-mode output voltage level is stabilized by controlling the PNP current sources Q4 and Q8.

The present invention, a bipolar transconductance element, as illustrated in FIG. 2a, comprises a pair of input stages 90 and 92 connected between a supply voltage Vcc 50 and current source 81, and a pair of gain stages 91 and 93 similarly connected in parallel between supply voltage Vcc 50 and current source 80. Input stages 90 and 92 are cascaded with gain stages 91 and 93, respectively, and correspond to the positive and negative ends of differential input voltage $V_i$ 51, respectively. These positive and negative halves are symmetrical.

Input stages 90 and 92 are biased by DC voltage supply $V_{DC}$ 84. Similarly, gain stages 91 and 93 are biased by biaser 94. Positive end gain stage 91 and negative end gain stage 93 possess output terminals 52 and 53, respectively. Across output terminals 52 and 53 is output current $I_0$ 54. Output current $I_0$ 54 is proportional to differential voltage input $V_i$ 51 between input terminal 46 on positive end input stage 90 and input terminal 47 on negative end input stage 92.

Both positive end input stage 90 and negative end input stage 92 consist of series-connected transistors and a resistor. In input stage 90, there is biasing transistor Q2, whose collector 15 is connected to supply voltage Vcc 50, base 14 is connected to DC voltage source 84, and emitter 13 is connected to collector 12 of transistor Q1. Transistor Q2 sets the DC bias for input to transistor Q3 and performs logarithmic predistortion to linearize the overall multiplier function. Transistor Q1, an active transistor, receives at its base 11 the positive differential input of $V_i$ 51. Emitter 10 of active transistor Q1 is series-connected to resistor 70. The other end of resistor 70 is connected to current source 81 to ground. Biasing transistor Q2 of positive input stage 90 is connected to reference voltage 84. Emitter 13 of the bias transistor Q2, which is connected to the collector 12 of active transistor Q1, serves as the output node 57 of input stage 90. It is to this node on the input stage 90 where gain stage 91 is series-connected. The circuitry of input stage 92 is symmetrical in all aspects to that just described.

$$I(Q2) = I(Q1) - \frac{I_{DC}}{2} + I_{BASE}(Q3) \approx I(Q1) - \frac{I_{DC}}{2}$$

$$I(Q6) = I(Q5) - \frac{I_{DC}}{2}$$

$$I(Q1) = \frac{I_2}{2} + \frac{V_i}{R_E}$$

$$I(Q5) = \frac{I_1}{2} - \frac{V_i}{2R_E}$$

when $V_i$ is applied across the bases of Q1, Q5.

This results in a voltage difference $\Delta V$ across the bases of Q3, Q7 which can be expressed as:

$$\Delta V = 2V_T \tanh^{-1}\left(\frac{V_i}{R_E I_1}\right)$$

This voltage difference results in a difference in current between the transistors Q3, Q7 which can be expressed as:

$$\Delta I = I_2 \tanh\left(\frac{\Delta V}{2V_T}\right) = \frac{I_2}{I_1} \frac{V_i}{R_E}$$

The difference $\Delta I/2$ with the fixed current $I_2/2$ flows into the circuit at one terminal and out at the other.

Positive end input stage 90 is cascade-connected to positive end gain stage 91. Negative end input stage 92 is connected to the negative end gain stage 93, similarly cascaded. Gain stages 91 and 93 are symmetrical, as are input stages 90 and 92.

Gain stage 91 consists of bias transistor Q4 and active transistor Q3 series-connected between voltage supply Vcc 50 and current source 80. Emitter 16 of active transistor Q3 is connected to current source 80. Base 17 of the active transistor Q3 of the gain stage serves as input terminal 55 for gain stage 91. That is, output terminal 57 of input stage 90 connects to input terminal 55 (base 17 of active transistor Q3) of gain stage 91. Also connected to base 17 of active transistor Q3 is current source 82 connected to the voltage supply Vcc 50.

Current source 82 injects current into the junction 55 of input stage 90 and gain stage 91. The base of the biasing transistor Q4 in gain stage 91 is connected to a bias circuit 94 which stabilizes the common-mode voltage of the transconductance element. Emitter 21 of bias transistor Q4 is connected to supply voltage Vcc 50. Collector 19 of bias transistor Q4 in gain stage 91 is connected to collector 18 of active transistor Q3 in the same stage. This connection, collector-collector, serves as the current output terminal 52 for gain stage 91. The circuitry of gain stage 93 is symmetrical in all aspects of that just described.

The action of gain stage 91 is dependent on voltage difference between nodes 57 and 58. When the output voltage 57 from input stage 90 drops (simultaneously voltage at node 58 increases), then the current flowing into collector 18 of active transistor Q3 of that gain stage will also drop. Bias transistor Q4 of gain stage 91 acts as a constant current source. Therefore, when the collector current of active transistor Q3 is forced to diminish, the surplus constant current is diverted to output terminal 52 of gain stage 91. Conversely, if the voltage at base 17 of active transistor Q3 of gain stage 91 (the input terminal 55 of that stage) increases (and voltage at base 29 decreases) then the collector current of active transistor Q3 will increase and draw current away from output terminal 52 of gain stage 91. The function of negative end gain stage 93 is identical to that just described.

The bases of biasing transistors Q4 and Q8 within gain stages 91 and 93, are connected to biaser 94. Output 59 of biaser 94 is from comparator 86 which receives on its positive input 42 a reference voltage 85, which provides for quiescent bias voltage at the bases of the bias transistors. Inverting input 41 of comparator 86 receives an average (hence, only the DC value) of the voltages present at the output terminals of the positive and negative end gain stages. Output terminals 52 and 53 are connected to the bases 36 and 39 of transistors Q9 and Q10 within biaser 94; collectors 37 and 40 of transistors Q9 and Q10 are connected to supply voltage Vcc 50. Emitters 35 and 38 of transistors Q9 and Q10 are connected through resistors 72 and 73 to ground voltage.

The aggregate current $I_{DC}$ from current sources 82 and 83 adds an additional degree of freedom to the circuit. The input dynamic range remains determined by the product $R_E \times I_1$, while $\tau$ and $\omega_0$ are now given by:

$$\tau = CR_E(I_1 - I_{DC})/I_2;$$ [Eq. 4]

$$\omega_0 \sim I_2/[CR_E(I_1 - I_{DC})]$$ [Eq. 5]

A model of the circuit of FIG. 2a is illustrated in FIG. 2b. Input voltage $V_I$ is coupled at inputs 46 and 47 to the transconductance element 113. The output $I_0$ 54 of the transconductance element 113 is coupled to a unity gain buffer/level shifter 114. The level shifter 114 provides an output $V_0$.

Figures 3A, 3B:
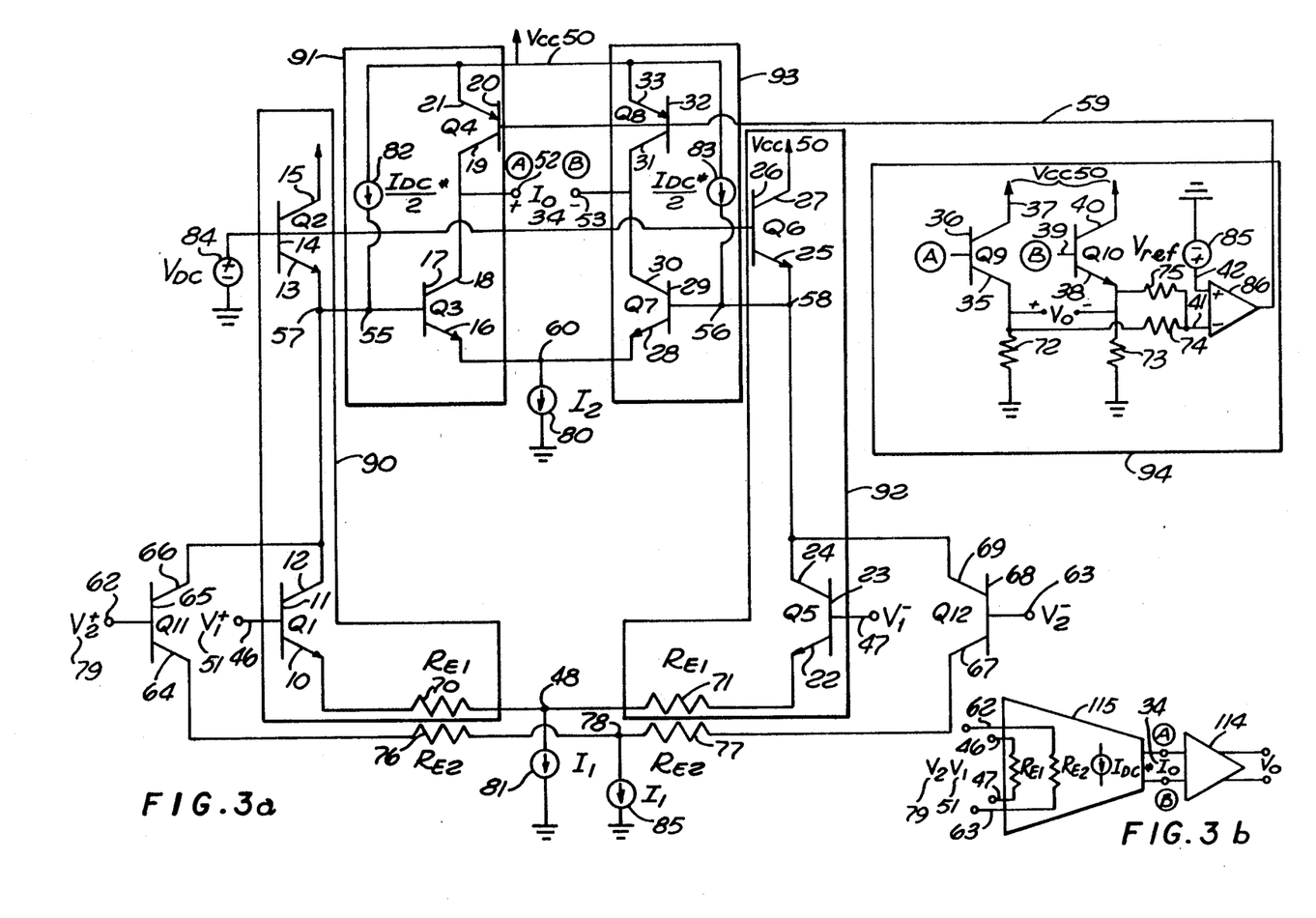
FIG. 3a is another embodiment of the present invention for multiple input transconductance elements.
FIG. 3b is a model of the circuit of FIG. 3.

Two or more of the novel transconductances can be readily combined into one circuit as illustrated in FIG. 3a. The circuit of FIG. 3a adds additional transistors Q11 and Q12 and emitter resistors 76 and 77. A second input voltage 79 is provided to positive input 62 and negative input 63. (Original input voltage 51 across inputs 46 and 47 is also provided.) The positive terminal 62 is coupled to the base 65 of transistor Q11. The collector 66 of transistor Q11 is coupled to the collector 12 of transistor Q1 at node 57. The emitter 64 of transistor Q11 is coupled through resistor 76 to node 78.

Negative input 63 is coupled to the base 68 of transistor Q12. The collector 69 of transistor Q12 is coupled to the collector 24 of transistor Q5 at node 58. The emitter 67 of transistor Q12 is coupled through resistor 77 to node 78. Current $I_1$ 85 is taken from node 78.

The gain of this dual input circuit is $$I_0 = G_{M1}V_1 + G_{M2}V_2 \qquad [Eq.\ 6]$$

where:

$$G_{M1} = (1/R_{E1})(I_2/(2I_1 - I_{DC^*})); \qquad [Eq.\ 7]$$

$$G_{M2} = (1/R_{E2})(I_2/(2I_1 - I_{DC^*})). \qquad [Eq.\ 8]$$

If one chooses $I_{DC^*} = I_{DC} + I_1$, equation 6 becomes:

$$I_0 = (1/R_{E1})(I_2/(I_1 - I_{DC}))V_1 + (1/R_{E2})(I_2/(I_1 - I_{DC}))V_2 \qquad [Eq.\ 9]$$

This is exactly the same expression as would be obtained by putting two transconductances (as shown in FIG. 2a) in parallel. However, the dramatic savings in transistor count and area (particularly the PNP transistors are large), and power consumption realized by the configuration of FIG. 3a are obvious. In addition, the output admittance ($G_0 + C_0$) in FIG. 3a is not affected by the number of inputs. In contrast, simply paralleling two single-input transconductances would double the output admittance.

The model of the multiple input transconductance element of FIG. 3a is illustrated in FIG. 3b. The transconductance element 115 receives dual inputs; input $V_1$ 51 at inputs 46 and 47 and voltage $V_2$ 79 at input 62 and 63. These voltages are coupled to equivalent resistances RE1 and RE2, respectively. The dual input transconductance element 115 provides an output $I_0$ 34 to buffer/level shifter 114. Level shifter 114 provides output $V_0$.

Figure 5:
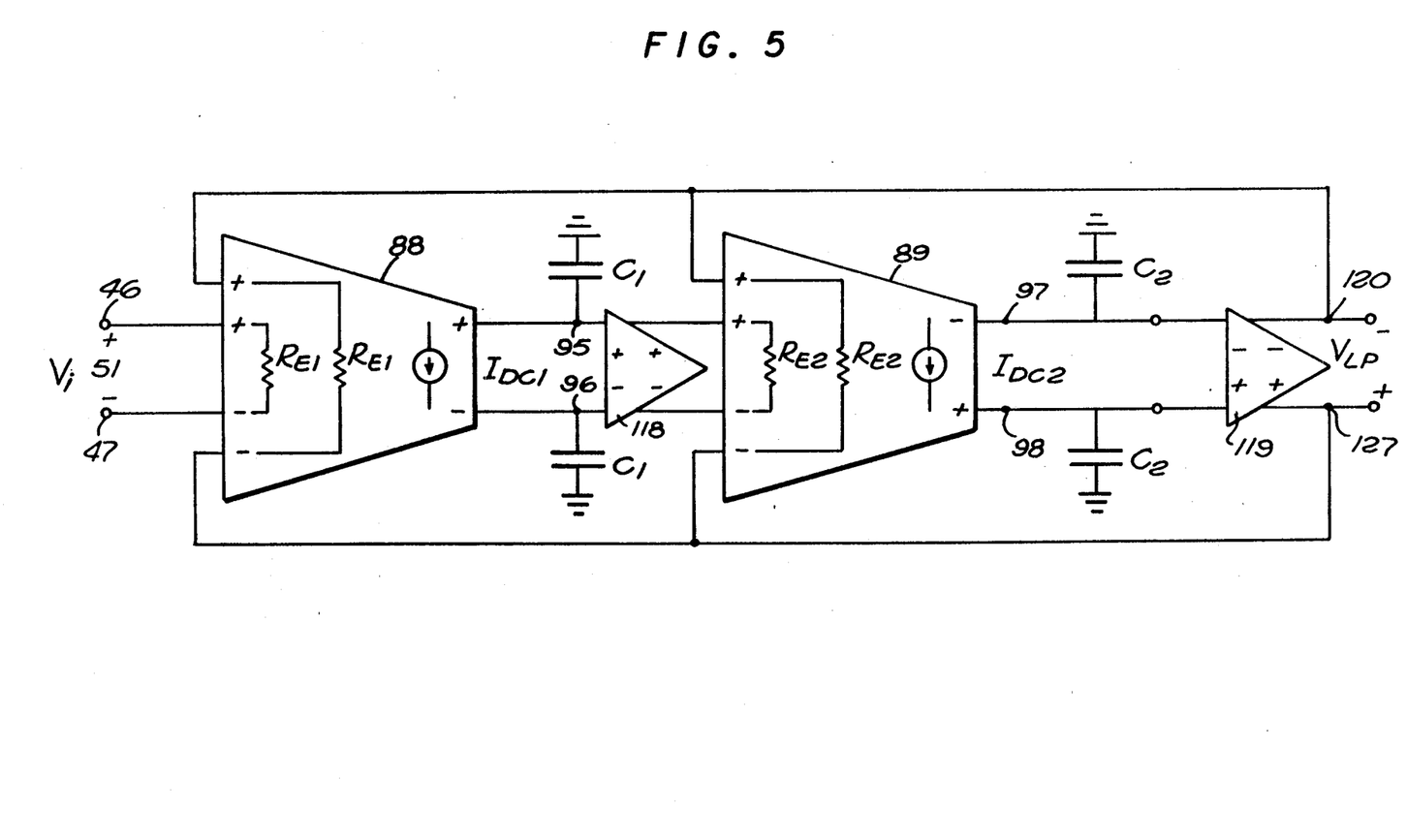
FIG. 5 is a embodiment of the present invention for differential input, differential output state-variable biquads.

The merits of this new approach for the realization of fully differential state-variable biquads are illustrated in FIG. 5. The circuit of FIG. 5 utilizes dual differential-input single differential output transconductance as in FIG. 3. $V_i$ 51 is coupled on inputs 46 and 47 to the first transconductance element 88. The output of transconductance element 88 at nodes 95 and 96 is provided as input to buffer/level shifter 118. The output of level shifter 118 is provided as input to transconductance element 89. Node 95 is also coupled through capacitor C1 to ground and node 96 is coupled through an equivalent capacitor C1 to ground. The output of transconductance element 89 at nodes 97 and 98 is coupled to buffer/level shifter 119. The outputs of level shifter 119 at nodes 120 and 121 are coupled in a feedback loop to second inputs of transconductance elements 88 and 89, respectively. Node 97 is also coupled through capacitor C2 to ground and node 98 is coupled through equivalent capacitor C2 to ground. The voltage $V_{LP}$ is taken between nodes 120 and 121.

Figure 4A:
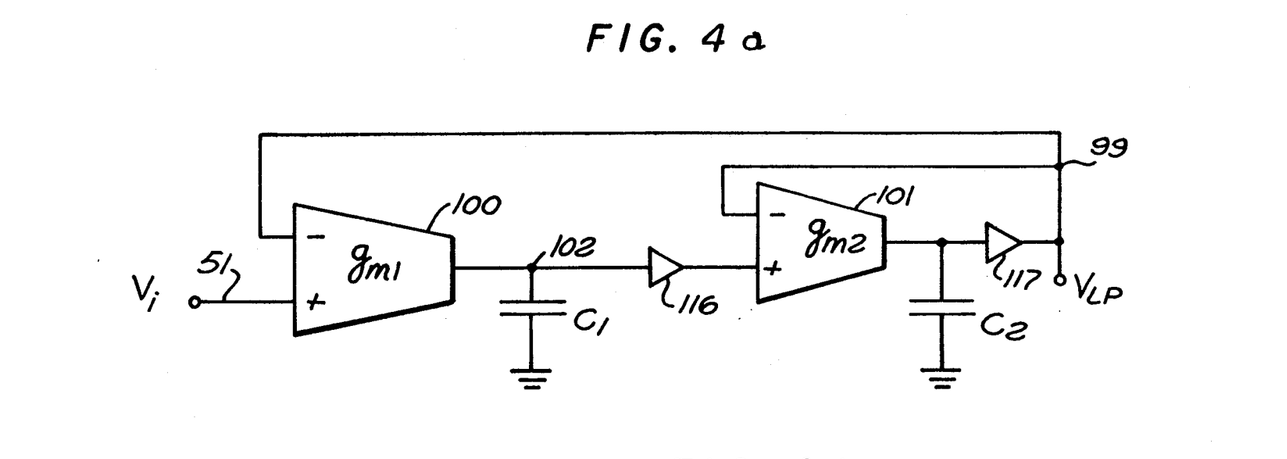
FIG. 4a is a circuit diagram of a state-variable biquad with differential input single-ended output transconductances.
Figure 4B:
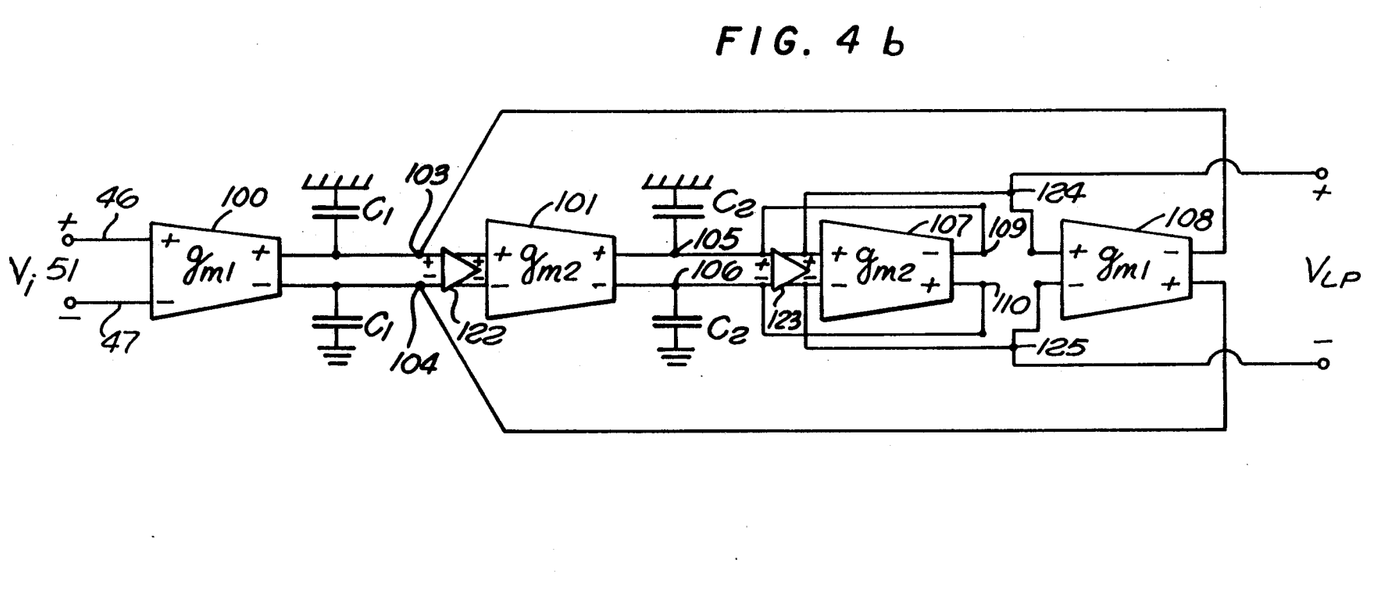
FIG. 4b is a circuit diagram of the fully-differential equivalent of FIG. 4a built with prior art differential input differential output transconductances.

FIG. 5 represents an improvement over the prior-art devices in FIGS. 4a-b. A traditional differential input and single-ended output biquadratic transconductance-C scheme with single-ended $V_i$ and $V_{LP}$ is illustrated in FIG. 4a. The input $V_i$ is coupled to the positive input of transconductance element 100. The output of transconductance element 100 at node 102 is coupled through capacitor C1 to ground and through level shifter 116 to the positive input of transconductance element 101. The output of transconductance element 101 is coupled through element C2 to ground and through level shifter 117 in a feedback loop to the negative inputs of transconductance elements 100 and 101, respectively. Voltage $V_{LP}$ is taken at node 99.

FIG. 4b illustrates a prior art fully-differential scheme. The input voltage $V_i$ 51 is coupled to the transconductance element 100 on inputs 46 and 47. The output of element 100 is provided at nodes 103 and 104. Node 103 is coupled through a capacitance C1 to ground and node 104 is coupled through a capacitance C1 to ground. Nodes 103 and 104 are also coupled as inputs to transconductance element 101 through level shifter 122. The output of transconductance element 101 is provided at nodes 105 and 106 which are coupled through capacitances C2 to ground. Nodes 105 and 106 are also provided as input to transconductance element 107 through level shifter 123. The output at nodes 109 and 110 of transconductance element 107 is coupled in feedback loops to the inputs of level shifter 123. The output of level shifter 123 is coupled to the inputs of transconductance element 108 at nodes 124 and 125. Nodes 124 and 125 also provide the output voltage $V_{LP}$. The output of transconductance element 108 is coupled in feedback loops to nodes 103 and 104.

The transfer function for the filter in FIG. 5 is:

$$V_{LP}/V_i = G_{M1}G_{M2}/(S^2 + S(G_{M1}/C_2) + (G_{M1}G_{M2}/C_1C_2)). \qquad [Eq.\ 10]$$

For the circuit in FIG. 5, we can identify pole frequency and pole quality factor as a function of the capacitors, resistors, and currents as follows:

$$\omega_0 = \sqrt{G_{M1}G_{M2}/C_1C_2} = (1/\sqrt{C_1C_2}) \cdot$$

$$\sqrt{(1/R_{E1}) \cdot (I_2/(2I_1 - I_{DC1})) \cdot (1/R_{E2}) \cdot (I_2/(2I_1 - I_{DC2}))}$$

$$Q_0 = \sqrt{(C_2/C_1)} \sqrt{(G_{M1}/G_{M2})} =$$

$$\sqrt{C_2/C_1} \cdot \sqrt{(R_{E2}(2I_1 - I_{DC2}))/(R_{E1}(2I_1 - I_{DC1}))}$$

If one now chooses $C_1 = C_2 = C$, $R_{E1} = R_{E2} = R_E$, i.e., all identical capacitors and resistors, resulting in optimum symmetry and best possible component matching, the pole frequency and Q are expressed as:

$$\omega_0 = (I_2/R_E C)/\sqrt{(2I_1 - I_{DC1})(2I_1 - I_{DC2})} \ ; \qquad [Eq.\ 13]$$

$$Q_0 = \sqrt{(2I_1 - I_{DC2})/(2I_1 - I_{DC1})} . \qquad [Eq.\ 14]$$

(Note that $I_{DC1}$ and $I_{DC2}$ can also be made negative if required.)

We conclude that appropriate selection of the injected currents $I_{DC1}$ and $I_{DC2}$ allows the realization of arbitrary pole frequency and pole quality factor without the need for capacitor ratioing. This is one more distinct advantage of this novel approach over existing biquad configurations. It should be mentioned here that, just as for the regular multiplier core, for optimum linearity and cancellation of parasitic effects caused by small and base resistors, the multiplier transistors area should be scaled proportional to their respective currents.

Thus, a bipolar tunable transconductance element and its use in a fully differential state-variable biquad has been described.

We claim:

1. A transconductance circuit comprising:
   a Gilbert multiplier core having first and second input stages for receiving a differential input voltage;
   first and second gain stages coupled to said first and second input stages, respectively, said first and second gain stages providing an output current;
   an input of said first gain stage coupled to a supply voltage through a first current source;
   an input of said second gain stage coupled to said supply voltage through a second current source.

2. The circuit of claim 1 further including a level shifting output buffer receiving said current output as an input providing a first output.

3. The circuit of claim 1 wherein:
   said first input stage is coupled to a first terminal of said input voltage, said second input stage is coupled to a second terminal of said input voltage, said first and second input stages each comprising a biasing transistor, an active transistor and a resistor connected in series, said first and second input stage connected in parallel between a supply voltage and a third current source to a ground, said biasing transistors of said first and second input biased by a first voltage source between a base terminal on each of said biasing transistors and ground.

4. The circuit of claim 3 wherein said first and second gain stages each comprise a biasing transistor and an active transistor connected in series, said gain stages connected in parallel between the voltage supply and a fourth current source to said ground, said biasing transistors of said first and second gain stages biased by a comparator, a base terminal of each of said active transistors of said first and second gain stages connected to said supply voltage by said first and second current sources.

5. The circuit of claim 4 wherein:
   said first gain stage connects to said first input stage via said base terminal of said active transistor of said first gain stage and a collector terminal of said active transistor of said first input stage, said second gain stage connects to said second input stage via said base terminal of said active transistor of said second gain stage and a collector terminal of said active transistor of said input stage;
   said comparator receiving as a first input a voltage level from a second voltage source, said comparator receiving as a second input an average of voltages present at a collector terminal of said active transistor of said first gain stage and a collector terminal of said active transistor of said second gain stage, said average derived by a series connection of each said collector terminals of said active transistors of said first and second gain stages through a transistor and resistor to said ground and a resistor to said second input of said comparator.

6. A circuit that converts a voltage to a current comprising:
   first and second input stages, said first input stage coupled to a first terminal of said voltage, said second input stage coupled to the a second terminal of said voltage;
   said first and second input stages comprise a biasing transistor connected with a parallel connected pair of a series-connected active transistor and a resistor; said first and second input stages connected in parallel between a supply voltage and first and second current sources to a ground;
   said biasing transistors of said first and second input stages biased by a first voltage source between a base terminal on said biasing transistors and said ground;
   first and second gain stages each comprising a biasing transistor and an active transistor connected in series, said gain stages connected in parallel between said supply voltage and a third current source to said ground, said biasing transistors of said first and second gain stages biased by a comparator; a base terminal of said active transistors of said first and second gain stages connected to said supply voltage by fourth and fifth current sources; where:
   said first gain stage is connected to said first input stage via a base terminal of said active transistor of said first gain stage and first and second collector terminals of said active transistors of said first input stage, said second gain stage is connected to said second input stage via a base terminal of said active transistor of said second gain stage and first and second collector terminals of said active transistors of said input stage;
   said comparator receiving as a first input a voltage level from a second voltage source, said comparator receiving as a second input an average of voltages present at a collector terminal of said active transistor of said first gain stage and a collector terminal of said active transistor of said second gain stage, said average derived by a series connection of each said collector terminal of said active transistors of said first and second gain stages through a transistor and a resistor to said ground and a resistor to said second input of said comparator.

7. The circuit of claim 6 further including a level shifting output buffer receiving said current output as an input and providing a first output.

8. A transconductance circuit comprising:
   a Gilbert multiplier core having first and second input stages for receiving an input voltage;
   first and second gain stages coupled to said first and second input stages, respectively, said first and second gain stages providing an output current; an input of said first gain stage coupled to a supply voltage through a first current source; an input of said second gain stage coupled to said supply voltage through a second current source; wherein:
   said first input stage is coupled to a first terminal of said input voltage, said second input stage is coupled to a second terminal of said input voltage, said first and second input stages each comprising a biasing transistor, an active transistor and a resistor connected in series, said first and second input stage connected in parallel between a supply voltage and a third current source to a ground, said biasing transistors of said first and second input biased by a first voltage source between a base terminal on each of said biasing transistors and ground;
   said first and second gain stages each comprise a biasing transistor and an active transistor connected in series, said gain stages connected in parallel between the voltage supply and a fourth current source to said ground, said biasing transistors of said first and second gain stages biased by a comparator, a base terminal of each of said active transistors of said first and second gain stages connected to said supply voltage by said first and second current sources;

said first gain stage connects to said first input stage via said base terminal of said active transistor of said first gain stage and a collector terminal of said active transistor of said first input stage, said second gain stage connects to said second input stage via said base terminal of said active transistor of said second gain stage and a collector terminal of said active transistor of said input stage;

said comparator receiving as a first input a voltage level from a second voltage source, said comparator receiving as a second input an average of voltages present at a collector terminal of said active transistor of said first gain stage and a collector terminal of said active transistor of said second gain stage, said average derived by a series connection of each said collector terminals of said active transistors of said first and second gain stages through a transistor and resistor to said ground and a resistor to said second input of said comparator.

9. The circuit of claim 8 further including a level shifting output buffer receiving said current output as an input and providing a first output.

* * * * *